(12) United States Patent
Kim

(10) Patent No.: US 8,127,169 B2
(45) Date of Patent: Feb. 28, 2012

(54) SEMICONDUCTOR MEMORY DEVICE AND METHOD FOR GENERATING INTERNAL CONTROL SIGNAL

(75) Inventor: Keun-Kook Kim, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 977 days.

(21) Appl. No.: 12/000,043

(22) Filed: Dec. 7, 2007

(65) Prior Publication Data

US 2008/0250262 A1 Oct. 9, 2008

(30) Foreign Application Priority Data

Apr. 3, 2007 (KR) .................. 10-2007-0032662

(51) Int. Cl.
*H04L 7/00* (2006.01)
*G06F 13/00* (2006.01)
*G06F 13/28* (2006.01)
(52) U.S. Cl. ................. 713/400; 711/100; 711/167
(58) Field of Classification Search .................. None
See application file for complete search history.

(56) References Cited

U.S. PATENT DOCUMENTS 5,909,588 A * 6/1999 Fujimura et al. .............. 712/23
5,987,618 A * 11/1999 DeRoo et al. ................ 713/400
6,567,321 B2 * 5/2003 Lee ............................... 365/193
6,944,738 B2 * 9/2005 Dong ............................ 711/167
7,764,545 B2 * 7/2010 Kim ......................... 365/185.11

FOREIGN PATENT DOCUMENTS

KR 10-2002-004011 5/2002
KR 10-2003-0015495 2/2003

OTHER PUBLICATIONS

Korean Office Action issued in Korean Patent Application No. KR 10-2007-0032662 dated on Sep. 30, 2008.

* cited by examiner

*Primary Examiner* — Ji H Bae
(74) *Attorney, Agent, or Firm* — IP & T Group LLP

(57) ABSTRACT

A semiconductor memory device includes: a command input unit configured to receive a plurality of external commands in synchronization with a rising edge of an internal clock to generate a plurality of pre-control signals; an output control signal generating unit configured to receive the plurality of external commands to generate an output control signal in synchronization with a falling edge of the internal clock prior to the rising edge of the internal clock; an address input unit configured to receive a plurality of addresses to output a plurality of internal addresses in response to the output control signal; and an internal driving signal generating unit configured to receive the plurality of internal addresses and the plurality of pre-control signals to generate a plurality of internal driving control signals.

20 Claims, 6 Drawing Sheets

SEMICONDUCTOR MEMORY DEVICE AND METHOD FOR GENERATING INTERNAL CONTROL SIGNAL

CROSS-REFERENCE TO RELATED APPLICATIONS

The present invention claims priority of Korean patent application number 10-2007-0032662, filed on Apr. 3, 2007, which is incorporated by reference in its entirety.

BACKGROUND OF THE INVENTION

The present invention relates to a semiconductor device, and more particularly, to a semiconductor memory device and a method for generating an internal control signal, capable of being fast driven with low power consumption.

Unlike a general dynamic random access memory (DRAM), a DRAM for a mobile device has given priority to power consumption rather than a driving speed. The DRAM for the mobile device will be referred to as a mobile DRAM. However, in recently years, the driving speed is also regarded as a very important factor. Input blocks for generating an internal control signal in the typical DRAM and the mobile DRAM will be described below.

FIG. 1 is a block diagram of an internal command generating circuit in a typical synchronous DRAM (SDRAM).

Referring to FIG. 1, the typical SDRAM includes first to third address buffers 12, first to third address latches 14, an address decoder 16, an address command combiner 18, first to fourth command buffers 22, first to fourth command latches 24 and a command decoder 26.

The first to third address buffers 12 receive addresses ADD1, ADD2 and ADD3, respectively. The first to third address latches 14 latch output signals of the first to third address buffers 12 and output internal addresses INT_ADD1, INT_ADD2 and INT_ADD3 in response to an internal clock CLK, respectively. The address decoder 16 decodes the internal addresses INT_ADD1, INT_ADD2 and INT_ADD3 to output a plurality of address information signals ADD_INFO<0:N>, N being a positive integer. The first to fourth command buffers 22 receive external commands /RAS, /CAS, /WE and /CS, respectively. The first to fourth command latches 24 latch output signals of the command buffers 22 and output internal commands /RAS_1, /CAS_1, /WE_1 and /CS_1 in response to the internal clock CLK, respectively. The command decoder 26 decodes the internal commands /RAS_1, /CAS_1, /WE_1 and /CS_1 to output pre-control signals PRE_ACT, PRE_WT, PRE_RD and PRE_MRS in response to the internal clock CLK. The address command combiner 18 combines output addresses of the address decoder 16 and the pre-control signals PRE_ACT, PRE_WT, PRE_RD and PRE_MRS to output a plurality of internal driving control signals INT_ACT<0:7>, INT_WT<0:7>, INT_RD<0:7> and MRS having address information.

Since the respective buffers and the respective latches are implemented with the same circuit configuration and are driven in the same manner, the reference numerals are assigned to only one buffer and one latch.

A method for driving the internal command generating circuit illustrated in FIG. 1 will be described below.

First, the external commands /RAS, /CAS, /WE and /CS and the addresses ADD1, ADD2 and ADD3 are inputted.

The first to third address buffers 12 receive the addresses ADD1, ADD2 and ADD3 and convert them into internal voltage levels, and the first to third address latches 14 latch output signals of the address buffers 12 and output the internal addresses INT_ADD1, INT_ADD2 and INT_ADD3 when the internal clock CLK has a logic low level. The address decoder 16 decodes the internal addresses INT_ADD1, INT_ADD2 and INT_ADD3 to output the plurality of address information signals ADD_INFO<0:N>.

The first to fourth command buffers 22 receive the external commands /RAS, /CAS, /WE and /CS and convert them into internal voltage levels, respectively. The first to fourth command latches 24 latch the output signals of the command buffers 22 and output the internal commands /RAS_1, /CAS_1, /WE_1 and /CS_1 when the internal clock CLK has a logic low level. The command decoder 26 decodes the internal commands /RAS_1, /CAS_1, /WE_1 and /CS_1 to output the plurality of pre-control signals PRE_ACT, PRE_WT, PRE_RD and PRE_MRS in response to the internal clock CLK of a logic high level.

The address command combiner 18 combines the pre-control signals PRE_ACT, PRE_WT, PRE_RD and PRE_MRS and the address information signals ADD_INFO<0:N> to output the internal driving control signals INT_ACT<0:7>, INT_WT<0:7>, INT_RD<0:7> and MRS. The internal driving control signals INT_ACT<0:7>, INT_WT<0:7>, INT_RD<0:7> and MRS are outputted in response to the internal clock CLK of a logic high level.

As described above, the internal driving control signals INT_ACT<0:7>, INT_WT<0:7>, INT_RD<0:7> and MRS are produced by combining address information and commands such as an active signal, a write signal, a read signal, and a mode register set signal and are used for controlling the driving of the specific blocks.

Meanwhile, unnecessary power consumption occurs in generating the internal driving control signals INT_ACT<0:7>, INT_WT<0:7>, INT_RD<0:7> and MRS. The necessary power is consumed because the address decoder 16 and the address command combiner 18 are driven even though commands requiring no address information are inputted.

Further, power consumption caused by the unnecessary driving greatly occurs in the mobile semiconductor memory device because of long lines on a chip layout for the internal addresses INT_ADD1, INT_ADD2 and INT_ADD3. For these reasons, many efforts have been made to reduce the power consumption. An internal control signal generating circuit for the mobile semiconductor memory device will be described below with reference to FIGS. 2 and 3.

FIG. 2 is a block diagram of an internal control signal generating circuit for a typical mobile semiconductor memory device.

Referring to FIG. 2, the typical mobile semiconductor memory device includes first to third address buffers 32, first to third address latches 34, an output controller 36, first to fourth command buffers 42, first to fourth command latches 44, a command decoder 46, an output control signal generator 50, an address decoder 60 and an address command combiner 70.

The first to third address buffers 32 receive addresses ADD1, ADD2 and ADD3 respectively. The first to third address latches 34 latch output signals of the first to third address buffers 32 in response to an internal clock CLK, respectively. The first to fourth command buffers 42 receive external commands /RAS, /CAS, /WE and /CS respectively. The first to fourth command latches 44 latch output signals of the command buffers 42 in response to the internal clock CLK and output internal commands /RAS_1, /CAS_1, /WE_1 and /CS_1, respectively. The command decoder 46 receives the internal commands /RAS_1, /CAS_1, /WE_1 and /CS_1 to output pre-control signals PRE_ACT, PRE_WT, PRE_RD and PRE_MRS, and the output control signal generator 50 receives the pre-control signals PRE_ACT, PRE_WT, PRE_RD and PRE_MRS to generate an output control signal AGC. The output controller 36 receives output signals of the first to third address latches 34 and transfers internal addresses INT_ADD1, INT_ADD2 and INT_ADD3 in response to the output control signal AGC. The address decoder 60 decodes the internal addresses INT_ADD1, INT_ADD2 and INT_ADD3 to output address information signals ADD_INFO<0:N>, N being a positive integer, and the address command combiner 70 combines the address information signals ADD_INFO<0:N> and the pre-control signals PRE_ACT, PRE_WT, PRE_RD and PRE_MRS to output a plurality of internal driving control signals INT_ACT<0:7>, INT_WT<0:7>, INT_RD<0:7> and MRS having address information.

FIG. 3 is a circuit diagram of the command decoder 46 illustrated in FIG. 2.

Referring to FIG. 3, the command decoder 46 includes a signal input unit 46A, a signal transfer unit 46B, and a latch unit 46C.

The signal input unit 46A is configured to receive the internal commands /RAS_1, /CAS_1, /WE_1 and /CS_1. The signal transfer unit 46B is configured to invert an output signal of the signal input unit 46A in response to the internal clock CLK of a logic low level. The latch unit 46C is configured to latch an output signal of the signal transfer unit 46B in response to the internal clock CLK of a logic high level and output the pre-control signal PRE_ACT.

In the command decoder 46, only a block for generating the pre-control signal PRE_ACT is illustrated in FIG. 3. Although not shown in FIG. 3, decoding blocks for generating the pre-control signals PRE_WT, PRE_RD and PRE_MRS are separately provided in the command decoder 46.

An operation of the command decoder 46 will be described below.

The signal input unit 46A activates the output signal to a logic high level when the internal commands /RAS_1, /CAS_1, /WE_1 and /CS_1 are activated to a logic high level. The signal transfer unit 46B transfers the output signal of the signal input unit 46A to the latch unit 46C while the internal clock CLK is a logic low level, and the latch unit 46C latches and outputs the pre-control signal PRE_ACT in response to the internal clock CLK of a logic high level.

An operation of the mobile semiconductor memory device will be described below.

The external commands /RAS, /CAS, /WE and /CS and the addresses ADD1, ADD2 and ADD3 are inputted.

The first to third address buffers 32 receive the addresses ADD1, ADD2 and ADD3 and convert them into internal voltage levels, and the first to third address latches 34 latch the output signals of the first to third address buffers 32 in synchronization with a rising edge of the internal clock CLK.

The first to fourth command buffers 42 receive the external commands /RAS, /CAS, /WE and /CS and convert them into internal voltage levels, and the first to fourth command latches 44 latch the output signals of the first to fourth command buffers 42 while the internal clock CLK is a logic low level, and output the internal commands /RAS_1, /CAS_1, /WE_1 and /CS_1. The command decoder 46 decodes the internal commands /RAS_1, /CAS_1, /WE_1 and /CS_1 and outputs the pre-control signals PRE_ACT, PRE_WT, PRE_RD and PRE_MRS while the internal clock CLK is a logic high level.

The output control signal generator 50 activates the output control signal AGC when one of the pre-control signals PRE_ACT, PRE_WT, PRE_RD and PRE_MRS is activated.

The output controller 36 outputs the outputs of the first to fourth command latches 44 as the internal addresses INT_ADD1, INT_ADD2 and INT_ADD3 in response to the output control signal AGC.

The address decoder 60 decodes the internal addresses INT_ADD1, INT_ADD2 and INT_ADD3 to output the plurality of address information signals ADD_INFO<0:N>.

The address command combiner 70 combines the pre-control signals PRE_ACT, PRE_WT, PRE_RD and PRE_MRS and the address information signals ADD_INFO<0:N> to output the internal driving control signals INT_ACT<0:7>, INT_WT<0:7>, INT_RD<0:7> and MRS having the address information.

As described above, the mobile semiconductor memory device further includes the output control signal generator 50 and the output controller 36 for controlling the output of the internal addresses INT_ADD1, INT_ADD2 and INT_ADD3 in response to the activation of one of the pre-control signals PRE_ACT, PRE_WT, PRE_RD and PRE_MRS. The mobile semiconductor memory device of FIG. 2 differs from the SDRAM of FIG. 1 in that the internal addresses INT_ADD1, INT_ADD2 and INT_ADD3 are not toggled during a no-operation (NOP) section or a deselect-command (DSEL) section. Consequently, unnecessary power consumption can be prevented.

In using the mobile semiconductor memory device, a predetermined delay occurs until the internal addresses INT_ADD1, INT_ADD2 and INT_ADD3 and the pre-control signals PRE_ACT, PRE_WT, PRE_RD and PRE_MRS are ensured, thereby leading to decrease in the driving speed of the device. In other words, the output controller 36 and the output control signal generator 50 transfer the internal addresses INT_ADD1, INT_ADD2 and INT_ADD3 when one of the pre-control signals PRE_ACT, PRE_WT, PRE_RD and PRE_MRS is activated. In such a state that the pre-control signals PRE_ACT, PRE_WT, PRE_RD and PRE_MRS have been already applied to the address command combiner 70, the internal addresses INT_ADD1, INT_ADD2 and INT_ADD3 are applied to the address command combiner 70 through the output controller 36 and the address decoder 60. That is, the internal driving control signals INT_ACT<0:7>, INT_WT<0:7>, INT_RD<0:7> and MRS are not generated at a time point when the pre-control signals PRE_ACT, PRE_WT, PRE_RD and PRE_MRS are applied, but a predetermined delay occurs until the internal addresses INT_ADD1, INT_ADD2 and INT_ADD3 are applied. Due to this delay, the operating speed of the mobile semiconductor memory device is relatively slower than that of the general DRAM. On the other hand, recently, in mobile semiconductor memory devices, high speed is considered as important as low power consumption.

SUMMARY OF THE INVENTION

Embodiments of the present invention are directed to providing a semiconductor memory device that has a low power consumption and can be driven at a high speed.

In accordance with an aspect of the present invention, there is provided a semiconductor memory device, including: a command input unit configured to receive a plurality of external commands in synchronization with a rising edge of an internal clock to generate a plurality of pre-control signals; an output control signal generating unit configured to receive the plurality of external commands to generate an output control signal in synchronization with a falling edge of the internal clock prior to the rising edge of the internal clock; an address input unit configured to receive a plurality of addresses to output a plurality of internal addresses in response to the output control signal; and an internal driving signal generating unit configured to receive the plurality of internal addresses and the plurality of pre-control signals to generate a plurality of internal driving control signals.

In accordance with an aspect of the present invention, there is provided a semiconductor memory device, including: a command input unit configured to receive a plurality of external commands in synchronization with a rising edge of an internal clock to generate a plurality of pre-control signals; an output control signal generating unit configured to receive the plurality of external commands to generate an output control signal in synchronization with a falling edge of the internal clock prior to the rising edge of the internal clock, or to receive a part of the plurality of pre-control signals to generate the output control signal; an address input unit configured to receive a plurality of addresses to output a plurality of internal addresses in response to the output control signal; and an internal driving signal generating unit configured to receive the plurality of internal addresses and the plurality of pre-control signals to generate a plurality of internal driving control signals.

In accordance with an aspect of the present invention, there is provided a method for generating an internal control signal of a semiconductor memory device, including: receiving a plurality of external commands to generate an output control signal in synchronization with a falling edge of an internal clock; receiving the plurality of external commands to generate a plurality of pre-control signals in synchronization with a rising edge prior to the falling edge of the internal clock; receiving a plurality of addresses to output a plurality of internal addresses in response to the output control signal; and receiving the plurality of internal addresses and the plurality of pre-control signals to generate a plurality of internal driving control signals.

In accordance with an aspect of the present invention, there is provided a method for generating an internal control signal of a semiconductor memory device, including: receiving a plurality of external commands in synchronization with a rising edge of an internal clock to generate a plurality of pre-control signals; receiving the plurality of external commands to generate an output control signal in synchronization with a falling edge of the internal clock prior to the rising edge of the internal clock, or receiving a part of the plurality of pre-control signals to generate the output control signal; receiving a plurality of addresses to output a plurality of internal addresses in response to the output control signal; and receiving the plurality of internal addresses and the plurality of pre-control signals to generate a plurality of internal driving control signals.

DESCRIPTION OF SPECIFIC EMBODIMENTS

Hereinafter, a semiconductor memory device having an internal control signal generator in accordance with the present invention will be described in detail with reference to the accompanying drawings.

Figure 1:
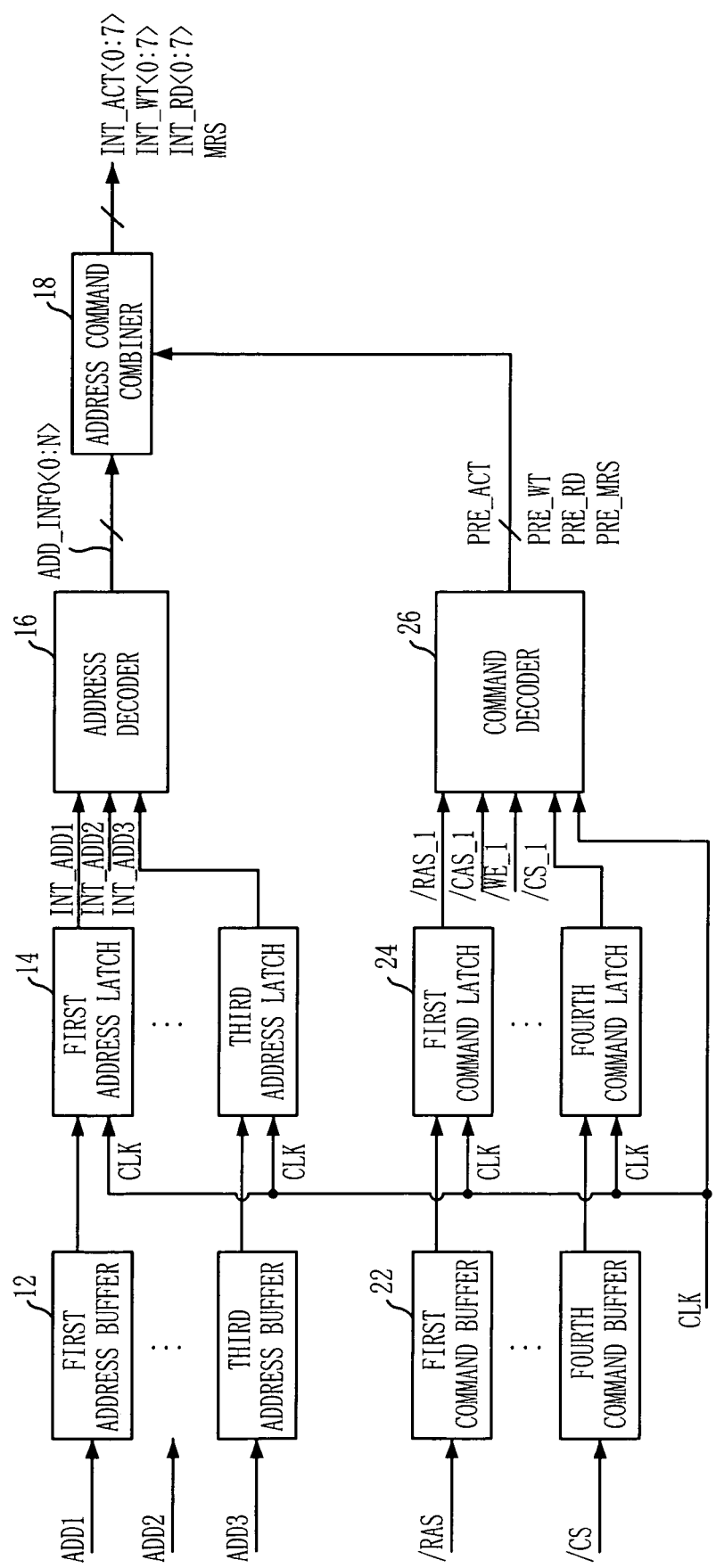
FIG. 1 is a block diagram of an internal command generating circuit in a typical SDRAM.
Figure 2:
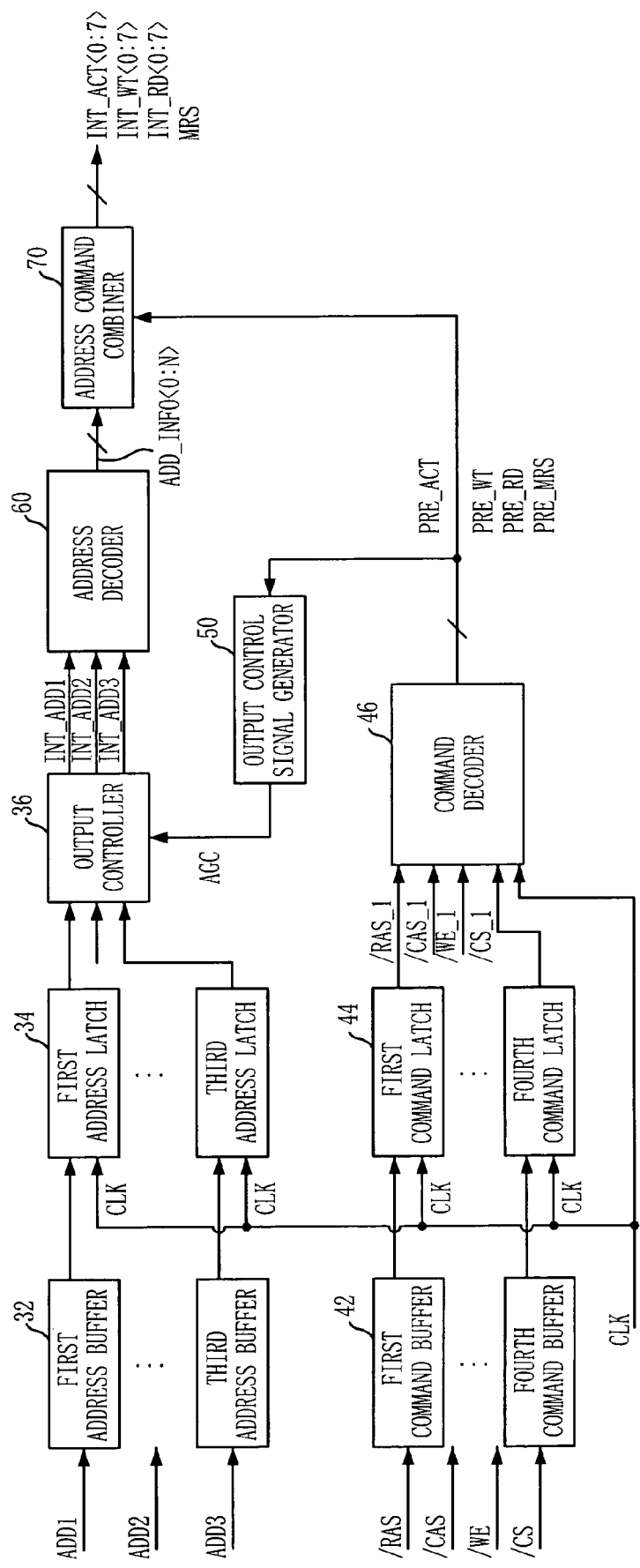
FIG. 2 is a block diagram of an internal control signal generating circuit for a typical mobile semiconductor memory device.
Figure 3:
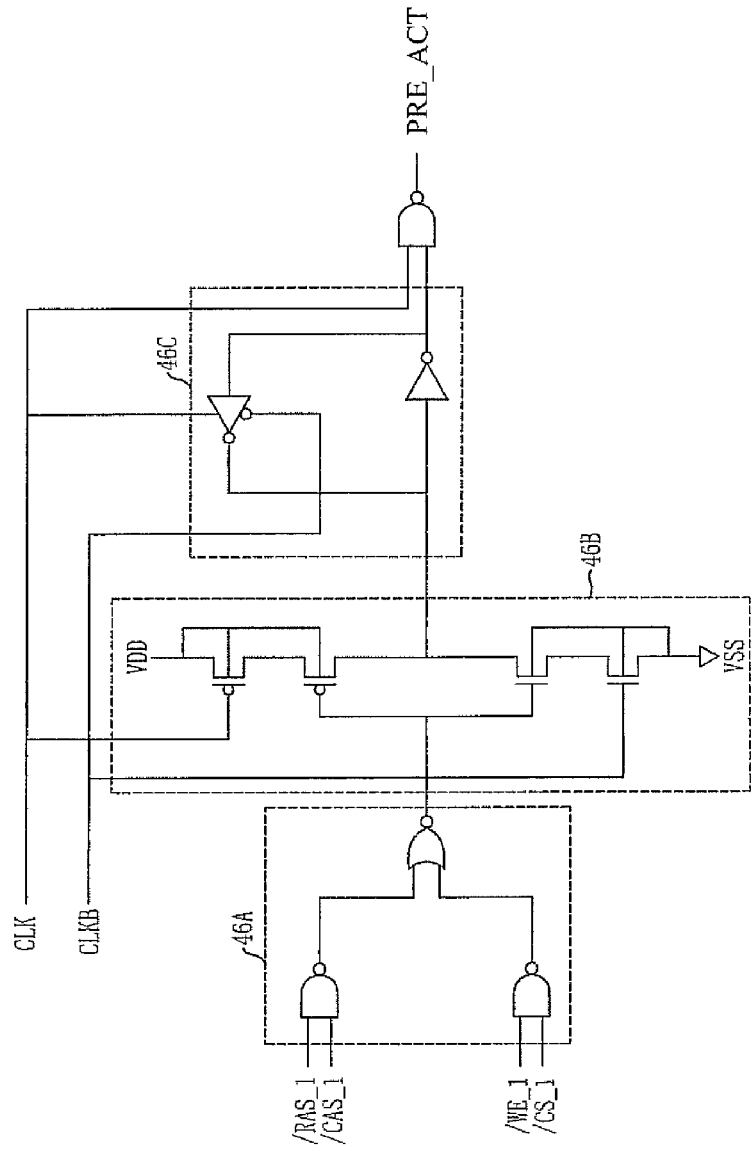
FIG. 3 is a circuit diagram of a command decoder illustrated in FIG. 2.
Figure 4:
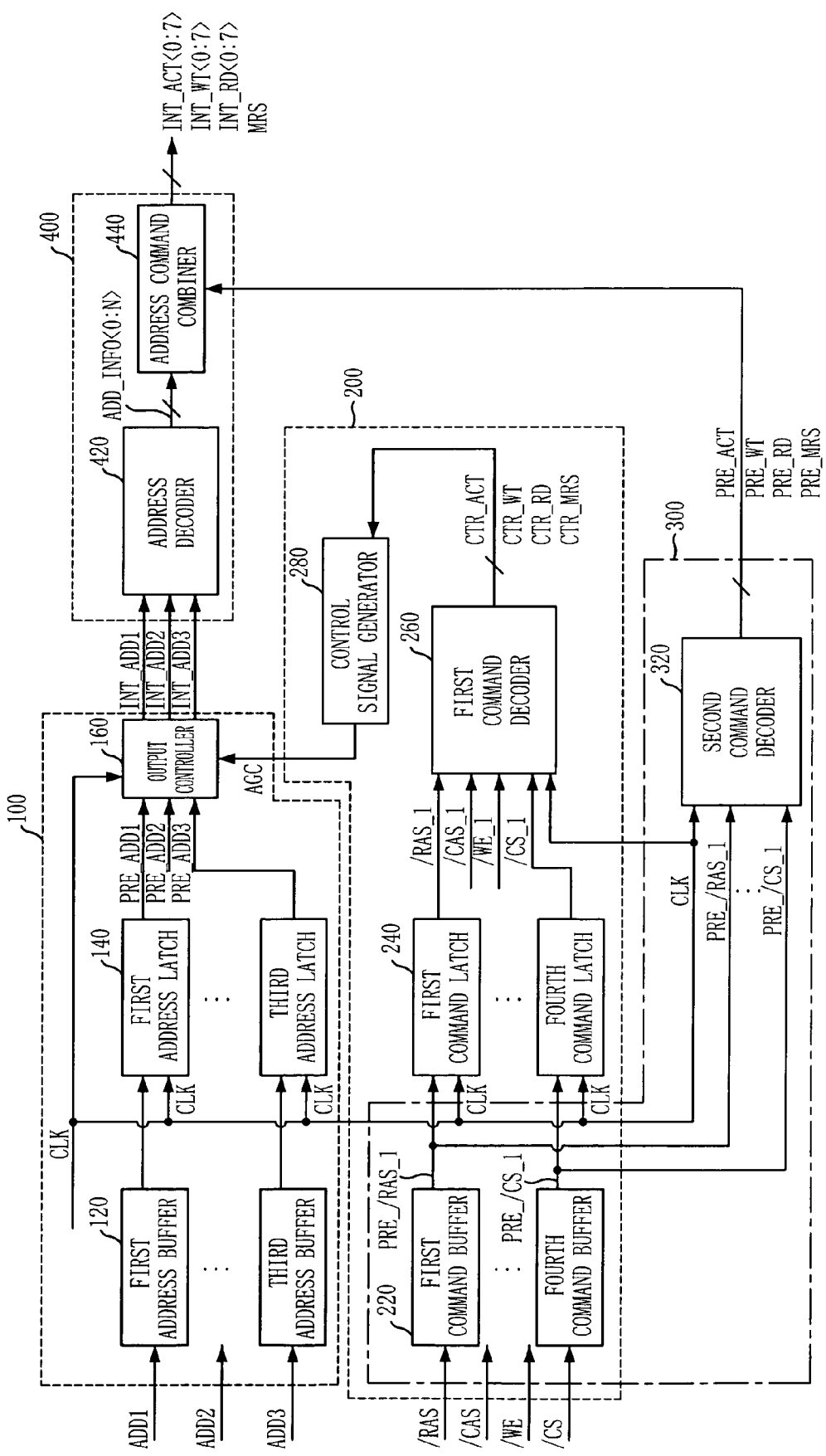
FIG. 4 is a block diagram of an internal control signal generating circuit in a mobile semiconductor memory device in accordance with a first embodiment of the present invention.

FIG. 4 is a block diagram of an internal control signal generating circuit in a mobile semiconductor memory device in accordance with a first embodiment of the present invention.

Referring to FIG. 4, the mobile semiconductor memory device includes an address input unit 100, an output control signal generating unit 200, a command input unit 300, and an internal driving signal generating unit 400.

The command input unit 300 receives a plurality of external commands /RAS, /CAS, /WE and /CS to generate a plurality of pre-control signals PRE_ACT, PRE_WT, PRE_RD and PRE_MRS. The output control signal generating unit 200 receives the external commands /RAS, /CAS, /WE and /CS to generate an output control signal AGC in synchronization with a falling edge of the internal clock CLK. The address input unit 100 receives a plurality of addresses ADD1, ADD2 and ADD3 to output a plurality of internal addresses INT_ADD1, INT_ADD2 and INT_ADD3 in response to the output control signal AGC. The internal driving signal generating unit 400 receives the internal addresses INT_ADD1, INT_ADD2 and INT_ADD3 and the pre-control signals PRE_ACT, PRE_WT, PRE_RD and PRE_MRS to generate a plurality of internal driving control signals INT_ACT<0:7>, INT_WT<0:7>, INT_RD<0:7> and MRS.

In addition, the command input unit 300 includes first to fourth command buffers 220 and a second command decoder 320. The first to fourth command buffers 220 are configured to receive the corresponding external commands /RAS, /CAS, /WE and /CS to output a plurality of pre-internal commands PRE_/RAS_1, PRE_/CAS_1, PRE_/WE_1 and PRE_/CS_1. The second command decoder 320 is configured to receive the pre-internal commands PRE_/RAS_1, PRE_/CAS_1, PRE_/WE_1 and PRE_/CS_1 to output the pre-control signals PRE_ACT, PRE_WT, PRE_RD and PRE_MRS in synchronization with a rising edge of the internal clock CLK.

The output control signal generating unit 200 includes first to fourth command buffers 220, first to fourth command latches 240, a first command decoder 260, and a control signal generator 280. The first to fourth command buffers 220 are configured to receive the corresponding external commands /RAS, /CAS, /WE and /CS to output the pre-internal commands PRE_/RAS_1, PRE_/CAS_1, PRE_/WE_1 and PRE_/CS_1. The first to fourth command latches 240 are configured to latch the corresponding pre-internal commands PRE_/RAS_1, PRE_/CAS_1, PRE_/WE_1 and PRE_/CS_1 in synchronization with a falling edge of the internal clock CLK and output the internal commands /RAS_1, /CAS_1, /WE_1 and /CS_1. The first command decoder 260 is configured to receive the internal commands /RAS_1, /CAS_1, /WE_1 and /CS_1 to output a plurality of pre-output control signals CTR_ACT, CTR_WT, CTR_RD and CTR_MRS in response to the internal clock CLK of a logic low level. The control signal generator 280 is configured to receive the pre-output control signals CTR_ACT, CTR_WT, CTR_RD and CTR_MRS to generate the output control signal AGC.

The address input unit 100 includes first to third address buffers 120, first to third address latches 140, and an output controller 160. The first to third address buffers 120 are configured to receive the corresponding addresses ADD1, ADD2 and ADD3, and the first to third address latches 140 are configured to latch output signals of the corresponding address buffers 120 in response with a falling edge of the internal clock CLK and output a plurality of pre-internal addresses PRE_ADD1, PRE_ADD2 and PRE_ADD3. The output controller 160 is configured to receive the pre-internal addresses PRE_ADD1, PRE_ADD2 and PRE_ADD3 to output the internal addresses INT_ADD1, INT_ADD2 and INT_ADD3 in response to the output control signal AGC.

The internal driving signal generating unit 400 includes an address decoder 420 and an address command combiner 440. The address decode 420 is configured to decode the internal addresses INT_ADD1, INT_ADD2 and INT_ADD3 to output a plurality of address information signals ADD_INFO<0:N>, N being a positive integer. The address command combiner 440 is configured to combine the address information signals ADD_INFO<0:N> and the pre-control signals PRE_ACT, PRE_WT, PRE_RD and PRE_MRS to output a plurality of internal driving control signals INT_ACT<0:7>, INT_WT<0:7>, INT_RD<0:7> and MRS having address information.

Since the control signal generator 280 configured to receive the external commands /RAS, /CAS, /WE and /CS to generate the output control signal AGC and the second command decoder 320 configured to generate the pre-control signals PRE_ACT, PRE_WT, PRE_RD and PRE_MRS are separately provided, the mobile semiconductor memory device in accordance with the first embodiment of the present invention can eliminate a predetermined delay occurring in the internal addresses.

In other words, since the internal driving signal generating unit 400 is driven by the clock of a logic high level to generate the internal driving control signals INT_ACT<0:7>, INT_WT<0:7>, INT_RD<0:7> and MRS, the output control signal generating unit 200 is further provided which receives the external commands /RAS, /CAS, /WE and /CS at a falling edge of a leading internal clock CLK and generates the output control signal AGC when the address information is necessary. Since the output control signal AGC is generated in advance when the internal clock CLK is a logic low level, the delay occurring in the output control signal AGC can be eliminated.

Although the first to fourth command buffers 220 are shared by the command input unit 300 and the output control signal generating unit 200 in the above embodiment, they can also be separately provided to the command input unit 300 and the output control signal generating unit 200.

The respective components of the internal control signal generating circuit will be described below in detail with reference to FIGS. 5 and 6.

Figure 5:
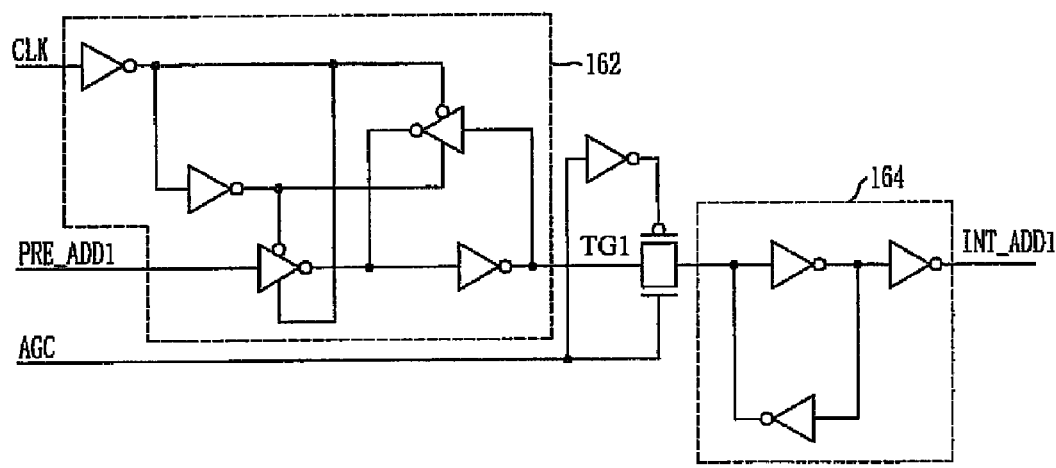
FIG. 5 is a circuit diagram of an output controller illustrated in FIG. 4.

FIG. 5 is a circuit diagram of the output controller 160 illustrated in FIG. 4.

Referring to FIG. 5, the output controller 160 includes a flip-flop 162, a transfer gate TG1, and a latch 164. The flip-flop 162 is configured to receive the pre-internal address PRE_ADD1 in response to the internal clock CLK of a logic low level and latches the pre-internal address PRE_ADD1 in response to the internal clock CLK of a logic high level. The transfer gate TG1 is configured to transfer an output signal of the flip-flop 162 in response to the output control signal AGC. The latch 164 is configured to latch an output signal of the transfer gate TG1 and output the internal address INT_ADD1.

An operation of the output controller 160 will be described below.

First, the flip-flop 162 receives the pre-internal address PRE_ADD1 in response to the internal clock CLK of a logic low level and latches the received address PRE_ADD1 in response to the internal clock CLK of a logic high level. The transfer gate TG1 transfers the output signal of the flip-flop 162 in response to the activation of the output control signal AGC. Then, the latch 164 latches the address outputted from the transfer gate TG1 and outputs the latched address as the internal address INT_ADD1.

That is, the output controller 160 receives the pre-internal address PRE_ADD1 in response to the internal clock CLK of a logic low level and latches the received pre-internal address PRE_ADD1 in response to the internal clock CLK of a logic high level. Then, the output controller 160 outputs the latched address as the internal address INT_ADD1 in response to the activation of the output control signal AGC.

The flip-flop 162, the transfer gate TG1, and the latch 164 included in the output controller 160 are provided for the respective bits of the pre-internal addresses PRE_ADD1, PRE_ADD2 and PRE_ADD3. Since the circuits for the pre-internal addresses PRE_ADD1, PRE_ADD2 and PRE_ADD3 are implemented with the same configuration, only the block for the pre-internal address PRE_ADD1 is exemplarily illustrated in FIG. 5.

Figure 6:
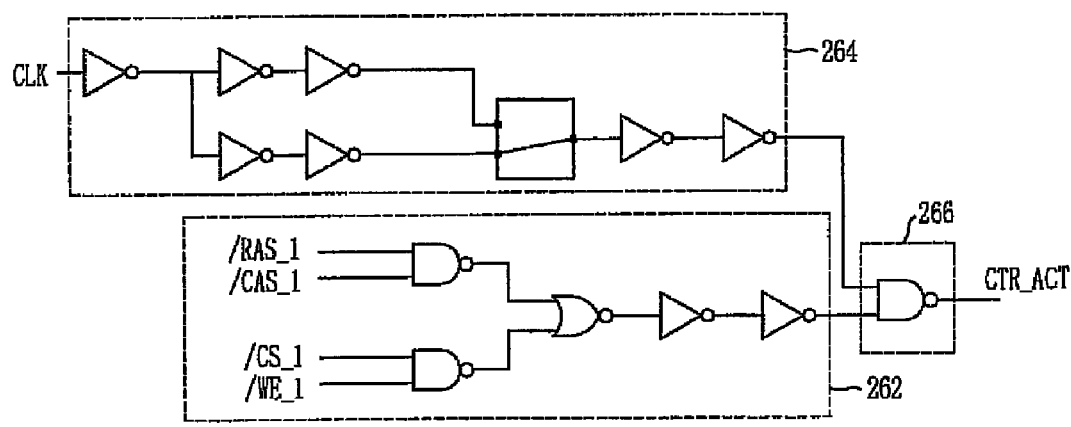
FIG. 6 is a circuit diagram of a first command decoder illustrated in FIG. 4.

FIG. 6 is a circuit diagram of the first command decoder 260 illustrated in FIG. 4.

Referring to FIG. 6, the first command decoder 260 includes a clock input unit 264, a signal input unit 262, and a signal output unit 266. The clock input unit 264 is configured to receive the internal clock CLK, the signal input unit 262 is configured to receive the internal commands /RAS_1, /CAS_1, /WE_1 and /CS_1. The signal output unit 266 is configured to output an output signal of the signal input unit 262 in response to an output signal of the clock input unit 264.

In the clock input unit 264, two inverter chains having different paths for the internal clock CLK have different driving forces and the device is implemented with a switch or metal option such that the signal is outputted through one path.

Upon operation, the signal input unit 262 activates its output signal to a logic high level in response to the activation of the internal commands /RAS_1, /CAS_1, /WE_1 and /CS_1. The clock input unit 264 activates its output signal to a logic high level in synchronization with the falling edge of the internal clock CLK. When the output signal of the clock input unit 264 is activated to the logic high level, the signal output unit 266 inverts the output signal of the signal input unit 262 to output the inverted output signal as the pre-output control signal CTR_ACT.

In other words, when the internal commands /RAS_1, /CAS_1, /WE_1 and /CS_1 are activated, the first command decoder 260 activates the pre-output control signal CTR_ACT to a logic low level in response to the internal clock CLK of a logic low level.

Only the block for generating the pre-output control signal CTR_ACT is illustrated in FIG. 6, and the blocks for generating the pre-output control signals CTR_WT, CTR_RD and CTR_MRS are separately provided in the first command decoder 260.

Hereinafter, an operation of the semiconductor memory device illustrated in FIGS. 4 to 6 will be described.

First, the external commands /RAS, /CAS, /WE and /CS and the addresses ADD1, ADD2 and ADD3 are inputted.

The first to third address buffers 120 receive the corresponding addresses ADD1, ADD2 and ADD3 converted into the internal voltage levels, and the first to third address latches 140 latches the output signals of the address buffers 120 and outputs the pre-internal addresses PRE_ADD1, PRE ADD2 and PRE ADD3 in synchronization with the falling edge of the internal clock CLK.

The first to fourth command buffers 220 receive the external commands /RAS, /CAS, /WE and /CS converted into the internal voltage levels and output the pre-internal commands PRE_/RAS_1, PRE_/CAS_1, PRE_/WE_1 and PRE_/CS_1. The first to fourth command latches 240 latch the corresponding pre-internal commands PRE_/RAS_1, PRE_/CAS_1, PRE_/WE_1 and PRE_/CS_1 and output them as the internal commands /RAS_1, /CAS_1, /WE_1 and /CS_1 in synchronization with the falling edge of the internal clock CLK. The first command decoder 260 decode the internal commands /RAS_1, /CAS_1, /WE_1 and /CS_1 to output the pre-output control signals CTR_ACT, CTR_WT, CTR_RD and CTR_MRS in response to the internal clock CLK of a logic low level.

The control signal generator 280 activates the output control signal AGC when one of the pre-output control signals CTR_ACT, CTR_WT, CTR_RD and CTR_MRS is activated.

The output controller 160 transfers the pre-internal addresses PRE_ADD1, PRE_ADD2 and PRE_ADD3 outputted from the first to third address latches 140 as the internal addresses INT_ADD1, INT_ADD2 and INT_ADD3 in response to the output control signal AGC.

The address decoder 420 decodes the internal addresses INT_ADD1, INT_ADD2 and INT_ADD3 to output the address information signals ADD_INFO<0:N>.

The second command decoder 320 decodes the pre-internal commands PRE_/RAS_1, PRE_/CAS_1, PRE_/WE_1 and PRE_/CS_1 and outputs the pre-control signals PRE_ACT, PRE_WT, PRE_RD and PRE MRS in synchronization with the rising edge of the internal clock CLK.

The address command combiner 440 combines the pre-control signals PRE_ACT, PRE_WT, PRE_RD and PRE_MRS and the address information signals ADD_INFO<0:N> to output the internal driving control signals INT_ACT<0:7>, INT_WT<0:7>, INT_RD<0:7> and MRS.

Meanwhile, the time point when the output control signal AGC is generated is influenced by an input setup time (tIS) of each latch. As the margin of the setup time becomes greater, i.e., looser, the output control signal AGC is fast generated. The margin of the setup time in the high frequency driving becomes small, but it is not problematic because the output control signal AGC is generated prior to the rising edge of the internal clock CLK.

The addresses ADD1, ADD2 and ADD3 are received at the falling edge of the internal clock CLK, where its logic level is low, and they are outputted as the internal addresses INT_ADD1, INT_ADD2 and INT_ADD3 when the external commands /RAS, /CAS, /WE and /CS are commands requiring the address information. The pre-control signals PRE_ACT, PRE_WT, PRE_RD and PRE_MRS for the actual internal driving control signals INT_ACT<0:7>, INT_WT<0:7>, INT_RD<0:7> and MRS are generated at the rising edge of the internal clock CLK, where its logic level is high. Therefore, when the pre-control signals PRE_ACT, PRE_WT, PRE_RD and PRE_MRS are inputted to the address command combiner 440, the address information signals ADD_INFO<0:N> have been already prepared. Because the address information signals ADD_INFO<0:N> have been already prepared in generating the internal driving control signals INT_ACT<0:7>, INT_WT<0:7>, INT_RD<0:7> and MRS, it is possible to prevent the driving speed from being reduced by the delay of the address information signals ADD_INFO<0:N>.

Figure 7:
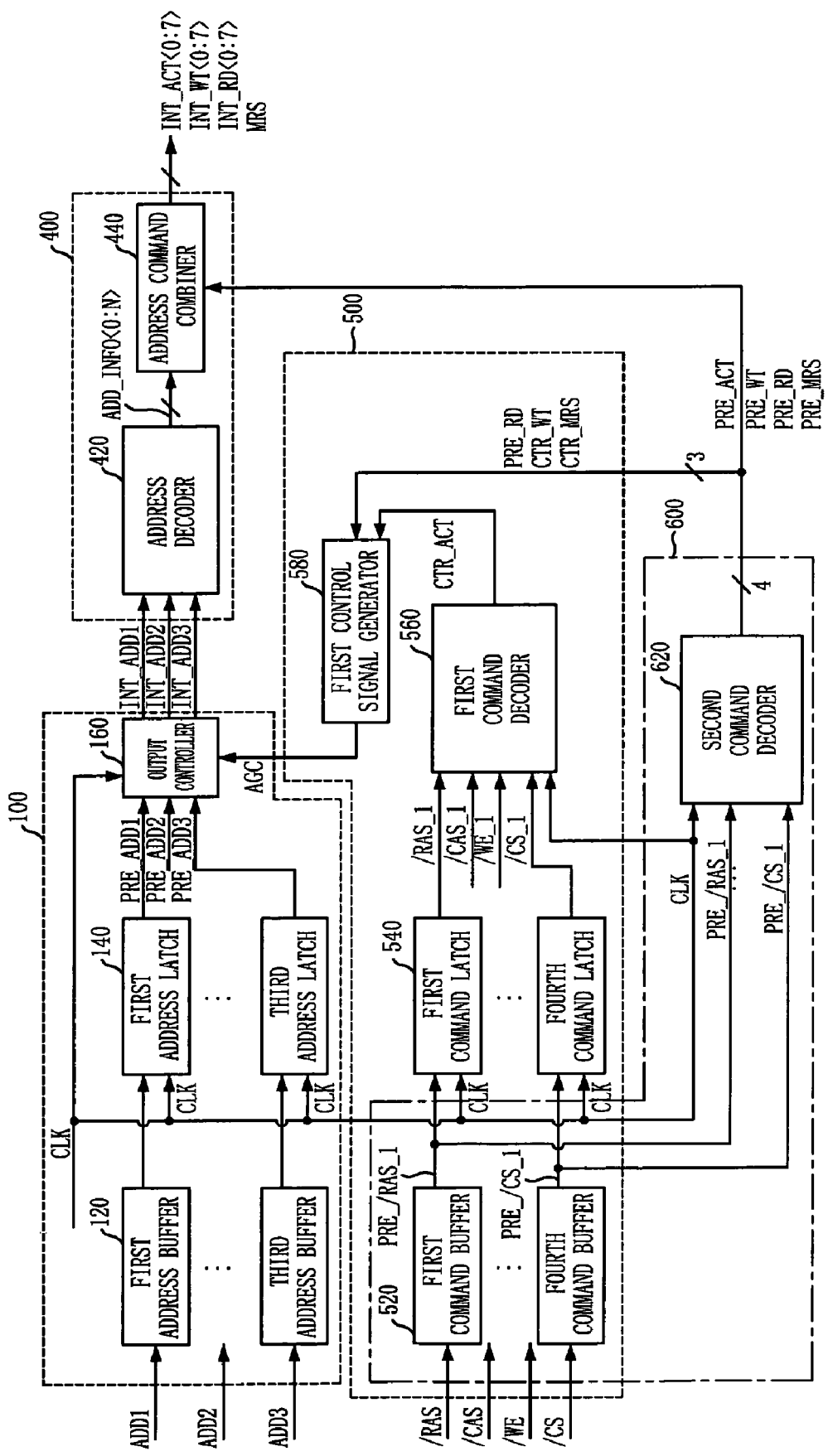
FIG. 7 is a block diagram of an internal control signal generating circuit in a mobile semiconductor memory device in accordance with a second embodiment of the present invention.

FIG. 7 is a block diagram of an internal control signal generating circuit in a mobile semiconductor memory device in accordance with a second embodiment of the present invention.

Referring to FIG. 7, the mobile semiconductor memory device includes a command input unit 600, an output control signal generating unit 500, an address input unit 100, and an internal driving signal generating unit 400. In FIGS. 4 and 7, like reference numerals are used to refer to the same elements.

The command input unit 600 receives a plurality of external commands /RAS, /CAS, /WE and /CS to generate pre-control signals PRE_WT, PRE_RD and PRE_MRS at a rising edge of an internal clock CLK. The output control signal generating unit 500 receives the external commands /RAS, /CAS, /WE and /CS and the pre-control signals PRE_ACT, PRE_WT, PRE_RD and PRE_MRS to generate an output control signal AGC. The address input unit 100 receives a plurality of addresses ADD1, ADD2 and ADD3 to output a plurality of internal addresses INT_ADD1, INT_ADD2 and INT_ADD3 in response to the output control signals AGC. The internal driving signal generator 400 receives the internal addresses INT_ADD1, INT_ADD2 and INT_ADD3 and the pre-control signals PRE_ACT, PRE_WT, PRE_RD and PRE_MRS to generate a plurality of internal driving control signals INT_ACT<0:7>, INT_WT<0:7>, INT_RD<0:7> and MRS.

The output control signal generating unit 500 includes first to fourth command buffers 520, first to fourth command latches 540, a first command decoder 560, and a control signal generator 580. The first to fourth command buffers 520 receive the external commands /RAS, /CAS, /WE and /CS to output a plurality of pre-internal commands PRE_/RAS_1, PRE_/CAS_1, PRE_/WE_1 and PRE_/CS_1, respectively. The first to fourth command latches 540 receive the pre-internal commands PRE_/RAS_1, PRE_/CAS_1, PRE_/WE_1 and PRE_/CS_1 to output a plurality of external commands /RAS_1, /CAS_1, /WE_1 and /CS_1 in synchronization with a falling edge of the internal clock CLK. The first command decoder 560 receives the internal commands /RAS_1, /CAS_1, /WE_1 and /CS_1 to output a plurality of pre-output control signals CTR_ACT, CTR_WT, CTR_RD and CTR_MRS. The control signal generator 580 receives the pre-control signals PRE_WT, PRE_RD and PRE_MRS to generate the output control signal AGC.

The command input unit 600 includes first to fourth command buffers 520 and a second command decoder 620. The first to fourth command buffers 520 are configured to receive the corresponding external commands /RAS, /CAS, /WE and /CS to output the plurality of pre-internal commands PRE_/RAS_1, PRE_/CAS_1, PRE_/WE_1 and PRE_/CS_1. The second command decoder 620 is configured to receive the pre-internal commands PRE_/RAS_1, PRE_/CAS_1, PRE_/WE_1 and PRE_/CS_1 to output the pre-control signals PRE_ACT, PRE_WT, PRE_RD and PRE_MRS in synchronization with a rising edge of the internal clock CLK.

The semiconductor memory device of FIG. 7 differs from the semiconductor memory device of FIG. 4 in that the control signal generator 580 receives the pre-control signals PRE_WT, PRE_RD and PRE_MRS. Since the other blocks in the semiconductor memory devices of FIGS. 4 and 7 are similar to one another, their detailed description will be omitted for conciseness.

Only when the active command is inputted, the semiconductor memory device of FIG. 7 transfers the internal addresses INT_ADD1, INT_ADD2 and INT_ADD3 in response to a pre-output control signal CTR_ACT generated at the falling edge, i.e., the logic low level of the internal clock CLK. This is because that the timing margin until the active command is driven from its input is relatively small compared with the driving time points of other commands. If the pre-output control signal CTR_ACT is generated only when the active command is inputted, the first command decoder 560 can be implemented in a small area.

Hereinafter, an operation of the semiconductor memory device illustrated in FIG. 7 will be described.

The external commands /RAS, /CAS, /WE and /CS and the addresses ADD1, ADD2 and ADD3 are inputted.

The first to third address buffers 120 receive the corresponding addresses ADD1, ADD2 and ADD3 converted into internal voltage levels, and the first to third address latches 140 latch output signals of the corresponding address buffers and output the pre-internal addresses PRE_ADD1, PRE_ADD2 and PRE_ADD3.

The first to fourth command buffers 520 receive the corresponding external commands /RAS, /CAS, /WE and /CS to output the pre-internal commands PRE_/RAS_1, PRE_/CAS_1, PRE_/WE_1 and PRE_/CS_1, and the first to fourth command latches 540 latches output signals of the corresponding command buffers 540 and output the internal commands /RAS_1, /CAS_1, /WE_1 and /CS_1 in synchronization with the falling edge of the internal clock CLK. Then, the first command decoder 560 decodes the internal commands /RAS_1, /CAS_1, /WE_1 and /CS_1 to output the pre-output control signal CTR_ACT.

The control signal generator 580 activates the output control signal AGC when the pre-output control signal CTR_ACT or the pre-control signals PRE_WT, PRE_RD and PRE_MRS is activated.

The output controller 160 transfers the output addresses PRE_ADD1, PRE_ADD2 and PRE_ADD3 of the first to third address latches 140 as the internal addresses INT_ADD1, INT_ADD2 and INT_ADD3 in response to the output control signal AGC.

The address decoder 420 decodes the internal addresses INT_ADD1, INT_ADD2 and INT_ADD3 to output address information signals ADD_INFO<0:N>, N being a positive integer.

The second command decoder 620 decodes the pre-internal commands PRE_/RAS_1, PRE_/CAS_1, PRE_/WE_1 and PRE_/CS_1 to output the pre-control signals PRE_ACT, PRE_WT, PRE_RD and PRE_MRS in synchronization with the rising edge of the internal clock CLK.

The address command combiner 440 combines the pre-control signals PRE_ACT, PRE_WT, PRE_RD and PRE_MRS and the address information signals ADD_INFO<0:N> to output the internal driving control signals INT_ACT<0:7>, INT_WT<0:7>, INT_RD<0:7> and MRS having address information.

As described above, the semiconductor memory device of FIG. 7 generates in advance the internal addresses INT_ADD1, INT_ADD2 and INT_ADD3 in synchronization with the falling edge of the internal clock CLK prior to the activation of the pre-control signal PRE_ACT only when the active command is inputted. Therefore, the first command decoder can be implemented in a small area because the circuit required in FIG. 4 of the first embodiment for detecting the input of the commands except the active command is unnecessary in the first command decoder 560. The timing margin from the input of the active command to its actual driving is small. However, the timing margin can be ensured because the internal addresses are generated in advance.

The semiconductor memory devices of FIGS. 4 and 7 generate the control signals requiring the address information to be in synchronization with the falling edge of the internal clock prior to the activation of the generation of the control signal. Hence, it is possible to increase the timing margin which is deficient due to the delay of the conventional internal addresses.

In addition, it is possible to eliminate power consumption occurring whenever the internal clock is toggled.

Since the semiconductor memory devices generate in advance the internal addresses only when the command requiring the address information is inputted, unnecessary power consumption can be prevented and DC/AC characteristics of the DRAM can be enhanced without delay of the driving speed.

Although the mobile semiconductor memory device has been described for illustrative purposes, the present invention can also be applied to general semiconductor memory devices.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a command input unit configured to generate a plurality of pre-control signals by using a plurality of external commands and in synchronization with a rising edge of an internal clock;
   an output control signal generating unit configured to generate an output control signal by using the plurality of external commands and in synchronization with a falling edge of the internal clock, wherein the falling edge of the internal clock occurs just prior to the rising edge of the internal clock;
   an address input unit configured to receive a plurality of addresses to output a plurality of internal addresses in response to the output control signal; and
   an internal driving signal generating unit configured to receive the plurality of internal addresses and the plurality of pre-control signals to generate a plurality of internal driving control signals.

2. The semiconductor memory device as recited in claim 1, wherein the output control signal generating unit includes:
   a plurality of first command buffers configured to receive the plurality of external commands to output a plurality of pre-internal commands;
   a plurality of command latches configured to latch the plurality of pre-internal commands in synchronization with the falling edge of the internal clock to output a plurality of internal commands;
   a first command decoder configured to decode the plurality of internal commands to output a plurality of pre-output control signals; and
   a control signal generator configured to generate the output control signal in response to activation of one of the pre-output control signals.

3. The semiconductor memory device as recited in claim 2, wherein the first command decoder includes:
   a clock input unit configured to receive the internal clock to activate its output signal in synchronization with a falling edge of the internal clock;
   a signal input unit configured to receive the internal commands to activate its output signal in response to activation of the internal commands; and
   a signal output unit configured to output the output signal of the signal input unit as the pre-output control signals in response to the output signal of the clock input unit.

4. The semiconductor memory device as recited in claim 3, wherein the clock input unit includes:
   first and second inverter chains, each having a different driving force; and
   a switch for selecting one of the first and second inverter chain.

5. The semiconductor memory device as recited in claim 2, wherein the command input unit includes:
   a second command decoder configured to receive the plurality of pre-internal commands and output the plurality of pre-control signals in synchronization with the rising edge of the internal clock.

6. The semiconductor memory device as recited in claim 1, wherein the output control signal generating unit includes a decoder configured to decode a plurality of internal commands to output a plurality of pre-output control signals and a control signal generator configured to generate the output control signal in response to the pre-output control signals and the command input unit includes a decoder configured to decode the plurality of internal commands to output of the plurality of pre-control signals.

7. The semiconductor memory device as recited in claim 1, wherein the address input unit includes:
   a plurality of address buffers configured to receive the plurality of addresses;
   a plurality of address latches configured to latch output signals of the plurality of address buffers in synchronization with the falling edge of the internal clock and output a plurality of pre-internal addresses; and
   an output controller configured to receive the plurality of pre-internal addresses to output the plurality of internal addresses in response to the output control signal.

8. The semiconductor memory device as recited in claim 7, wherein the output controller includes:
   a flip-flop configured to receive a first pre-internal address in response to a first logic level of the internal clock;
   a transfer gate configured to transfer an output signal of the flip-flop in response to the output control signal; and
   a latch configured to latch an output signal of the transfer gate to output a first internal address.

9. The semiconductor memory device as recited in claim 1, wherein the internal driving signal generating unit includes:
   an address decoder configured to decode the plurality of internal addresses; and
   an address command combiner configured to combine output addresses of the address decoder and the plurality of pre-control signals to output the plurality of internal driving control signals having address information.

10. A semiconductor memory device, comprising:
   a command input unit configured to generate a plurality of pre-control signals by using a plurality of external commands and in synchronization with a rising edge of an internal clock;
   an output control signal generating unit configured to generate an output control signal by using the plurality of external commands and in synchronization with a falling edge of the internal clock or to receive a part of the plurality of pre-control signals to generate the output control signal, wherein the falling edge of the internal clock occurs just prior to the rising edge of the internal clock;
   an address input unit configured to receive a plurality of addresses to output a plurality of internal addresses in response to the output control signal; and
   an internal driving signal generating unit configured to receive the plurality of internal addresses and the plurality of pre-control signals to generate a plurality of internal driving control signals.

11. The semiconductor memory device as recited in claim 10, wherein the output control signal generating unit includes:
   a plurality of first command buffers configured to receive the plurality of external commands to output a plurality of pre-internal commands;
   a plurality of command latches configured to latch the plurality of pre-internal commands in synchronization with the falling edge of the internal clock to output a plurality of internal commands;
   a first command decoder configured to decode the plurality of internal commands to output a pre-output control signal corresponding to an active command; and
   a control signal generator configured to generate the output control signal in response to activation of one of the pre-output control signal and the pre-control signals corresponding to commands except the active command.

12. The semiconductor memory device as recited in claim 11, wherein the command input unit includes:
   a second command decoder configured to receive the plurality of pre-internal commands and output the plurality of pre-control signals in synchronization with the rising edge of the internal clock.

13. The semiconductor memory device as recited in claim 10, wherein the output control signal generating unit includes a decoder configured to decode a plurality of internal commands to output a plurality of pre-output control signals and a control signal generator configured to generate the output control signal in response to the pre-output control signals and the command input unit includes a decoder configured to decode the plurality of internal commands to output the plurality of pre-control signals.

14. The semiconductor memory device as recited in claim 10, wherein the address input unit includes:
   a plurality of address buffers configured to receive the plurality of addresses;
   a plurality of address latches configured to latch output signals of the plurality of address buffers in synchronization with the falling edge of the internal clock and output a plurality of pre-internal addresses; and
   an output controller configured to receive the plurality of pre-internal addresses to output the plurality of internal addresses in response to the output control signal.

15. The semiconductor memory device as recited in claim 14, wherein the output controller includes:
   a flip-flop configured to receive a first pre-internal address in response to a first logic level of the internal clock;
   a transfer gate configured to transfer an output signal of the flip-flop in response to the output control signal; and
   a latch configured to latch an output signal of the transfer gate to output a first internal address.

16. The semiconductor memory device as recited in claim 10, wherein the internal driving signal generating unit includes:

an address decoder configured to decode the plurality of internal addresses; and an address command combiner configured to combine output addresses of the address decoder and the plurality of pre-control signals to output the plurality of internal driving control signals having address information.

17. A method for generating an internal control signal of a semiconductor memory, comprising:

generating an output control signal by using a plurality of external commands and in synchronization with a falling edge of an internal clock;

generating a plurality of pre-control signals by using the plurality of external commands and in synchronization with a rising edge of the internal clock, wherein the falling edge of the internal clock occurs just prior to the rising edge of the internal clock;

receiving a plurality of addresses to output a plurality of internal addresses in response to the output control signal; and receiving the plurality of internal addresses and the plurality of pre-control signals to generate a plurality of internal driving control signals.

18. The method as recited in claim 17, wherein the generating of the output control signal comprises:

latching the plurality of external commands and outputting a plurality of pre-internal commands in synchronization with the falling edge of the internal clock; and decoding the plurality of internal commands to generate the output control signal when a command for requiring the internal addresses is inputted.

19. A method for generating an internal control signal of a semiconductor memory device, comprising:

generating a plurality of pre-control signals by using a plurality of external commands and in synchronization with a rising edge of an internal clock;

generating an output control signal by using the plurality of external commands and in synchronization with a falling edge of the internal clock, or receiving a part of the plurality of pre-control signals to generate the output control signal, wherein the falling edge of the internal clock occurs just prior to the rising edge of the internal clock;

receiving a plurality of addresses to output a plurality of internal addresses in response to the output control signal; and receiving the plurality of internal addresses and the plurality of pre-control signals to generate a plurality of internal driving control signals.

20. The method as recited in claim 19, wherein the generating of the output control signal comprises:

latching the plurality of external commands to output a plurality of internal commands in synchronization with the falling edge of the internal clock;

decoding the plurality of internal commands to output a pre-output control signal in response to an active command; and generating the output control signal in response to activation of one of the pre-output control signals and the pre-control signals corresponding to commands except the active command.

\* \* \* \* \*